(12) United States Patent
Kim et al.

(10) Patent No.: US 7,785,753 B2
(45) Date of Patent: Aug. 31, 2010

(54) METHOD AND APPARATUS FOR PROVIDING MASK IN SEMICONDUCTOR PROCESSING

(75) Inventors: Yoojin Kim, San Jose, CA (US); Camelia Rusu, Fremont, CA (US); Jonathan Kim, Pleasanton, CA (US)

(73) Assignee: Lam Research Corporation, Fremont, CA (US)

( * ) Notice: Subject to any disclaimer, the term of this patent is extended or adjusted under 35 U.S.C. 154(b) by 975 days.

(21) Appl. No.: 11/383,835

(22) Filed: May 17, 2006

(65) Prior Publication Data

US 2007/0269721 A1 Nov. 22, 2007

(51) Int. Cl.
*G03F 1/00* (2006.01)
(52) U.S. Cl. .............................. 430/5; 430/311; 438/710
(58) Field of Classification Search .................. 430/5, 430/311; 716/19, 21; 438/696–727
See application file for complete search history.

(56) References Cited

U.S. PATENT DOCUMENTS

| | | | |
|---|---|---|---|
| 5,302,240 A | | 4/1994 | Hori et al. |
| 6,057,240 A | * | 5/2000 | Zhou et al. ................. 438/689 |
| 6,967,072 B2 | | 11/2005 | Latchford et al. |
| 7,049,052 B2 | | 5/2006 | Xiao et al. |
| 2002/0001778 A1 | | 1/2002 | Latchford et al. |
| 2004/0072440 A1 | * | 4/2004 | Kim et al. .................. 438/709 |
| 2005/0208756 A1 | * | 9/2005 | Matsushita et al. .......... 438/622 |
| 2006/0019487 A1 | * | 1/2006 | Leuschner et al. .......... 438/637 |
| 2006/0024968 A1 | * | 2/2006 | Hudson et al. .............. 438/700 |
| 2006/0118518 A1 | * | 6/2006 | Rusu et al. .................. 216/67 |

FOREIGN PATENT DOCUMENTS

| | | |
|---|---|---|
| WO | WO 2005/022623 A1 | 3/2005 |
| WO | WO 2005022623 A1 * | 3/2005 ............... 216/67 |

OTHER PUBLICATIONS

International Search Report dated Nov. 7, 2007 from corresponding International Application No. PCT/US2007/010629.
Written Opinion dated Nov. 7, 2007 from corresponding International Application No. PCT/US2007/010629.
Search Report dated Dec. 24, 2009 from Singapore Patent Application No. 200808443-6.
Written Opinion dated Dec. 24, 2009 from Singapore Patent Application No. 200808443-6.

\* cited by examiner

*Primary Examiner*—Mark F Huff
*Assistant Examiner*—Rashid Alam
(74) *Attorney, Agent, or Firm*—Beyer Law Group LLP (57) ABSTRACT

Disclosed is a method for processing a two layer mask for use in fabrication of semiconductor devices whereby the critical dimension (CD) of a semiconductor device being fabricated with the mask can be controlled. After forming a carbon mask layer and a silicon containing photoresist layer on the carbon mask, a two-step process forms openings in the carbon mask layer, as required for subsequent device fabrication. The structure is placed in a plasma processing chamber, and an oxygen plasma is employed to partially etch the carbon layer. The oxygen plasma reacts with silicon in the photoresist to form a hard silicon oxide layer on the surface of the photoresist. A hydrogen plasma is then employed to complete the etch through the carbon layer with a reduced critical dimension. Damage to the silicon containing photoresist layer is kept to a minimum during the plasma etch process by limiting the low frequency RF power.

21 Claims, 6 Drawing Sheets

METHOD AND APPARATUS FOR PROVIDING MASK IN SEMICONDUCTOR PROCESSING

BACKGROUND OF THE INVENTION

This invention relates generally to the processing of semiconductor substrates and material layers on semiconductor substrates in the fabrication of integrated circuit and other semiconductor devices, and more particularly the invention relates to masks for masking such substrates and layers for selective chemical processing.

Photoresist masking has long been employed in the fabrication of integrated circuits prior to chemical etching and dopant diffusion steps. Typically, a layer of energy sensitive resist is coated onto a substrate or another layer to be selectively chemically processed. An image of a pattern is formed in the photoresist by irradiation of the resist through an optical mask or reticle, and the developed photoresist is removed. The selectively masked substrate or layer can then be etched, by wet or dry (plasma) etch, or dopants can be introduced through the opening in the mask into the substrate or layer by diffusion or ion implantation.

With increasing densities of components in integrated circuits and the reduction of circuit dimensions into the sub-micron range, the thickness of the photoresist layer has been reduced to control pattern resolution. However, with deep sub-micron dimensions, the photoresist has become insufficient to mask underlying materials against chemical etchant.

In order to minimize the erosion of the thin resist during an etching process of underlying material layers, an intermediate layer (typically an oxide layer) is needed between the resist and the underlying material stack. Deep ultraviolet (DUV) imaging has also complicated the stack further by requiring incorporation of an anti-reflective coating (ARC). For deep and narrow features such as high aspect ratio contact (HARC) holes, a several thousand angstrom thick amorphous carbon layer is now routinely used in order to provide the selectivity required during the long (several minutes) etch process. Therefore, conventional multi-layer-resist (MLR) consists of a resist, an ARC layer, an intermediate layer (termed a hard mask) such as silicon oxynitride (SiON), and an amorphous carbon hard mask in the case of a HARC application on top of an underlying material layer.

More recently, it has become possible to eliminate the intermediate layer as well as the anti-reflective coating. The incorporation of silicon in the resist (SiPR) provides a means to generate silicon oxide on the outer surface of the resist, which then acts as a hard mask. The amorphous carbon layer (ACL) hard mask is currently deposited via a chemical vapor deposition (CVD) process, but a spin-on carbon (SOC) containing hard mask has also been introduced recently, which has superior optical properties and is more cost-effective than the ACL hard mask. Spin-on carbon is available from JSR Corporation of Japan.

Some drawbacks exist for the above bi-layer resist structure. In a conventional MLR stack, the intermediate layer (SiON) plays an important role other than as a hard mask, and this is to reduce the critical dimension (CD) defined by the resist patterning. Advances in both the resist pattern techniques and further CD reduction in the SiON layer have so far provided the required CD of the complicated features in current IC devices. As a result of the absence of the SiON layer, the CD reduction in a bi-layer mask described above now must be achieved during the pattern transfer to the carbon hard mask using plasma etching. A further problem is encountered with the silicon containing photoresist which is easily damaged by high-bias (high power at low RF frequencies) plasma etching, leading to serious micro-pitting in the bi-layer mask.

SUMMARY OF THE INVENTION

The present invention provides a method for fabricating a carbon mask whereby the critical dimension (CD) of a component processed with the mask can be reduced.

After forming a carbon mask layer and a silicon impregnated photoresist layer on the carbon mask, a two step process forms windows in the carbon mask layer as required for subsequent device processing. After developing a pattern through the photoresist layer, the structure is placed in a plasma processing chamber, and an oxygen plasma is employed to etch the underlying carbon layer. The oxygen plasma reacts with silicon in the photoresist to form a hard silicon oxide layer on the outer surface of the photoresist. A hydrogen plasma is then employed to complete the etch through the carbon layer, with the required CD reduction.

The use of the oxygen plasma forms a hard and protective silicon oxide layer on the photoresist surface, as recognized in the prior art. However, use of the oxygen plasma limits the critical dimension realizable when etching the carbon layer. The use of the hydrogen plasma provides reduced critical dimension, but causes micro-pitting of the silicon-containing photoresist layer. Termination of the oxygen plasma as a first step and use of a hydrogen plasma etch for the remaining carbon layer reduces the realizable critical dimension provided by the mask. The critical dimension is thus controlled by the ratio of oxygen plasma etching and hydrogen plasma etching.

In preferred embodiments, the low frequency RF (less than 27 MHz with oxygen plasma and less than 60 MHz with hydrogen plasma) power in the plasma chamber is reduced to less than 100 watts, or 50 watts, or eliminated during the plasma etching steps to completely eliminate micro-pitting of the photoresist layer.

The invention and object and features thereof will be more readily apparent from the following detailed description and appended claims when taken with the drawings.

DETAILED DESCRIPTION OF ILLUSTRATIVE EMBODIMENTS

The present invention relates to an etchant mask including a carbon hard mask for use in fabricating semiconductor devices, and particularly to the process of etching the carbon mask whereby critical dimensions in fabricated semiconductor devices are reduced. The mask processing is carried out in a plasma processor such as illustrated in FIG. 1.

Figure 1:
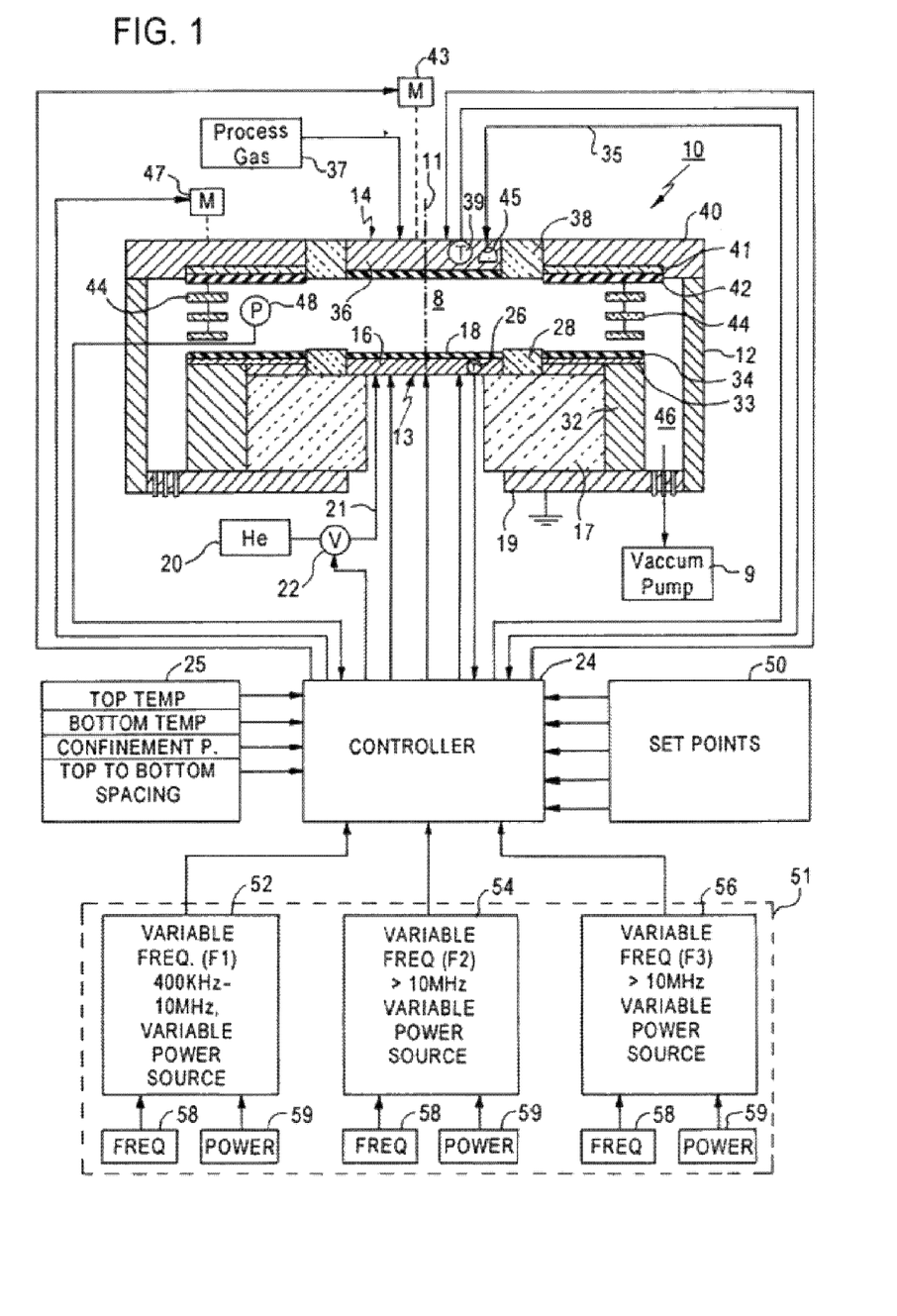
FIG. 1 is a partially schematic diagram of one embodiment of a vacuum plasma processor for carrying out the invention.

Reference is now made to FIG. 1 of the drawing wherein plasma processor vacuum chamber 10, having longitudinal axis (i.e., centerline) 11 is illustrated as including electrically conductive metal wall 12, bottom electrode assembly 13 and top electrode assembly 14. Wall 12 has a circular inner periphery, coaxial with axis 11. Wall 12 is grounded, i.e., at DC and RF reference potentials. Vacuum pump 9 maintains the interior of chamber 10 at a vacuum on the order of 0.001 to 500 torr during processing. The interior of chamber 10 includes confined plasma region 8 between a bottom boundary close to the top face of bottom electrode assembly 13 and a top boundary close to the bottom face of top electrode assembly 14; the side boundary of confined plasma region 8 is spaced from wall 12.

Bottom electrode assembly 13, frequently referred to as a bottom electrode, is coaxial with axis 11 and is secured to electric insulating ring 17, which in turn is secured to metal, grounded base 19 of chamber 10. Electrode assembly 13 includes circular, central metal electrode 16 that is coaxial with axis 11 and has an upper surface for receiving a circular workpiece 18, typically a semiconductor wafer having a diameter substantially equal to the diameter of metal electrode 16. When workpiece 18 is properly in place, its center is coincident with axis 11. Electrode 16 can be connected to a DC chucking voltage source (not shown) for clamping workpiece 18 to electrode 16 using electrostatic forces. The temperature of electrode 16 and workpiece 18 are controlled in a manner known to those skilled in the art by connecting helium source 20 to a region (not shown) in electrode 16 by way of conduit 21 and valve 22, responsive to an electric signal that controller 24 derives in response to (1) a temperature set point supplied to the controller by set point source 25 and (2) a measure of the temperature in the electrode, as indicated by a signal derived by temperature monitor 26 embedded in electrode 16.

Bottom electrode assembly 13 also includes electric insulator ring 28, typically made of quartz. Ring 28 is secured to the top face of insulator ring 17, is coaxial with axis 11 and has an inner diameter substantially equal to the diameter of workpiece 18 so that the periphery of workpiece 18, when the workpiece is properly in place, almost abuts the inner periphery of ring 28. The portion of the top face of ring 17 outside ring 28 and the side wall of ring 17 are covered by insulator ring 33 and grounded metal ring 32, respectively. Insulating ring 33 is overlaid by metal electrode ring 34 that can be covered or coated with a layer (not shown) of dielectric or conductive material. Electrically conductive ring 34 and the layer that covers or coats it are made of a material that does not contaminate the chemistry of the plasma in region 8. Such a material is a suitable relatively high conductivity semiconductor, e.g., intrinsic silicon. Alternatively, ring 34 is a metal covered by a suitable non-contaminating material. Ring 34 is electrically insulated from grounded metal ring 32 by dielectric, insulating ring 33 under certain circumstances and electrically connected to grounded ring 32 under other circumstances. Rings 33 and 34 are coaxial with axis 11, and extend horizontally between the outer edge of bottom electrode assembly 13 and ring 28.

Top electrode assembly 14 includes central electrode 36, coaxial with axis 11 and having a bottom face 36a made of electrically conductive intrinsic silicon that does not contaminate the chemistry of the plasma in region 8. Electrode 36 includes internal passages (not shown) and numerous showerhead openings (not shown), both connected in fluid flow relation to a suitable source 37 of process gases that flow through the showerhead openings into region 8 where the gases are converted into a plasma that processes workpiece 18. Electrode 36 includes a heating and/or cooling arrangement 45 responsive to an electric signal that controller 24 supplies to arrangement 45 via lead 35 in response to a set point signal supplied to the controller by set point source 25, as well as a signal indicative of the temperature of electrode 36, as derived by temperature gauge 39, embedded in assembly 14.

Assembly 14 also includes insulator ring 38 and metal ring 40. Ring 38 is coaxial with axis 11, preferably made of quartz and approximately aligned with ring 28. Ring 38 has an inner periphery abutting the outer periphery of central electrode 36. Metal ring 40, coaxial with axis 11, has inner and outer peripheries respectively abutting the outer periphery of insulator ring 38 and the inner periphery of side wall 12 so that ring 40 is at RF and DC ground potential. The lower, inner face of metal ring 40 is covered by electrical insulating ring 41 that carries an electrically conductive electrode ring 42. Electrode ring 42 is either coated or covered with a layer (not shown) of conductive or insulating material that does not contaminate the chemistry of the plasma in region 8. Ring 42 is electrically insulated from ring 40 and wall 12 by ring 41 and a downwardly depending flange (not shown) of ring 41 under certain circumstances and is electrically connected to ring 40 and wall 12 under other circumstances.

From the foregoing, confined plasma region 8 has a top boundary determined by (1) the bottom face 36a of electrode 36, (2) the bottom face of insulator ring 38 and (3) the bottom face of electrode ring 42, and a bottom boundary determined (1) by the top face of workpiece 18 (when the workpiece is in place), (2) the top face of insulator ring 28 and (3) the top face of electrode ring 34. Motor 43 controls the spacing between the top and bottom boundaries of region 8 by moving the bottom face of top electrode assembly 14 up-and-down relative to the top face of bottom electrode assembly 13. Motor 43 responds to a signal from controller 24 to set the spacing between the faces of electrode assemblies 13 and 14 at an experimentally determined optimum value for the particular frequencies that excite the plasma processing of workpiece 18, as derived from set point source 50.

The sides of confined plasma region 8 are bounded by spaced, vertically stacked louvers 44, made of a material that does not contaminate the chemistry of the plasma in region 8. The louvers 44 are made of a material that is either electrically insulating (preferably a dielectric, such as quartz) or somewhat electrically conductive (e.g. silicon carbide) so that the louvers are electrically powered, or float electrically or are electrically grounded. Louvers 44 are such that no substantial amount of plasma flows through the slots between louvers 44. However, un-ionized gas in region 8 escapes through the slots between louvers 44 to region 46 in chamber 10 between wall 12 and ring 32 and is pumped from the interior of chamber 10 by pump 9 through suitable openings in base 19.

Louvers 44 are fixedly spaced from each other in the vertical direction by a suitable spacing arrangement (not shown) and are driven up and down relative to each other and to bottom assembly 13 by motor 47 to control the pressure in confined plasma region 8. The pressure in region 8 is controlled by a pressure set point that set point source 25 supplies to controller 24 and an output signal of pressure gauge 48 in region 8. Controller 24 responds to the pressure set point and the output signal of pressure gauge 48 to control motor 47, and thereby vary the spacing between the bottom face of the lowest louver 44 and the top face of electrode assembly 13. Consequently, the pressure in region 8 is maintained at the pressure set point. Louvers 44 are arranged so that the louvers do not move in response to activation of motor 43, so that the pressure in confined plasma region 8 is controlled independently of the spacing between electrode assemblies 13 and 14.

Controller 24 responds to set point source 50 to control coupling of various combinations of several different RF frequencies from source arrangement 51 to electrodes 16, 34, 36 and 42. The different RF frequencies applied to electrodes 16, 34, 36 and 42 can have different powers and control different phenomena of the plasma in confined region 8. In the embodiment of FIG. 1, controller 24 selectively applies up to three frequencies from source arrangement 51 to electrodes 16, 34, 36 and 42. Source arrangement 51 is illustrated as including three separate sources 52, 54 and 56 that can be fixed frequency sources, but are preferably low-power, variable frequency oscillators. Alternately source arrangement 51 includes a single low power synthesizer that can derive three selected frequencies. The low power sources drive associated variable power gain RF power amplifiers having variable frequency pass bands that are varied as the frequency of the source associated with a particular amplifier is varied. To this end, each of sources 52, 54 and 56 has an associated frequency and power setting 58 and 59. Typically, the frequency of source 52 is in a relatively low range between 100 kHz and 10 MHz, the frequency of source 54 is in a midrange between 10 MHz and 150 MHz, and the frequency of source 56 is in a relatively high range between 27 MHz and 300 MHz. In one actually tested arrangement, the frequencies of sources 52, 54 and 56 were respectively set at 2 MHz, 27 MHz and 60 MHz. Various combinations of the frequencies and the powers of the RF energy applied to region 8 affect the distribution of the density of plasma, the ion energy and the DC bias voltage of the plasma in confined region 8, and the chemistry of the plasma in region 8.

The frequencies of sources 54 and 56 control the chemistry of the plasma because greater dissociation of the plasma occurs as the plasma excitation frequency increases, if all other significant plasma excitation parameters remain constant. In particular, there is an increase in the percentage of lighter etchant molecules in the plasma as frequency increases. The high frequencies applied to the plasma result in greater molecular fragmentation.

Driving electrodes 16, 34, 36 and 42 with various combinations of frequencies and powers from sources 52, 54 and 56 enables the plasma to be tailored for various purposes, e.g., to provide uniform or non-uniform plasma density, ion energy and molecular fragmentation.

Controller 24 responds to output signals from set point source 50 and the RF outputs of source arrangement 51 to control the application of several frequencies from source arrangement 51 to electrodes 16, 34, 36 and 42 in various combinations and permutations. In a particular embodiment, set point source 50 activates controller 24 so (1) at least one of the frequencies, but up to all three frequencies, from sources 52, 54 and 56 drive electrode 16 while electrodes 34, 36, and 42 are grounded; (2) at least two of the frequencies from sources 52, source 54 and 56 drive electrodes 16 and 36 while electrodes 34 and 42 are grounded; (3) only one of sources 54 or 56 drives either electrode 16 or 36 or only source 52 drives electrode 16, while electrodes 34 and 42 are grounded; (4) electrode 34 is driven by source 52 and/or source 54 or is connected to ground via a filter having a pass band for the frequency of source 52 and/or source 54 (i.e., frequencies F2 and F3) while the remaining electrodes 16, 36, and 42 have various connections to sources 52, 54, and 56; and (5) electrode 42 is driven by source 52 and/or source 54 or is connected to ground via a filter having a pass band for the frequency of source 52 and/or source 54 (i.e., frequencies F2 and F3) while the remaining electrodes 16, 34, and 36 have various connections to sources 52, 54, and 56.

Figure 2A:
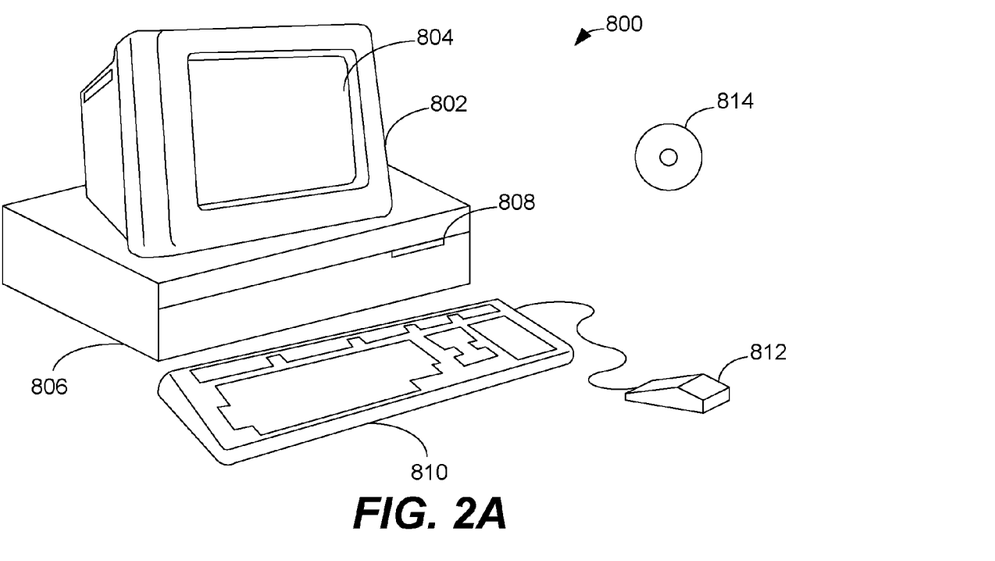
FIGS. 2A-2B illustrate a computer system which is suitable for implementing the controller in the plasma processor of FIG. 1.
Figure 2B:
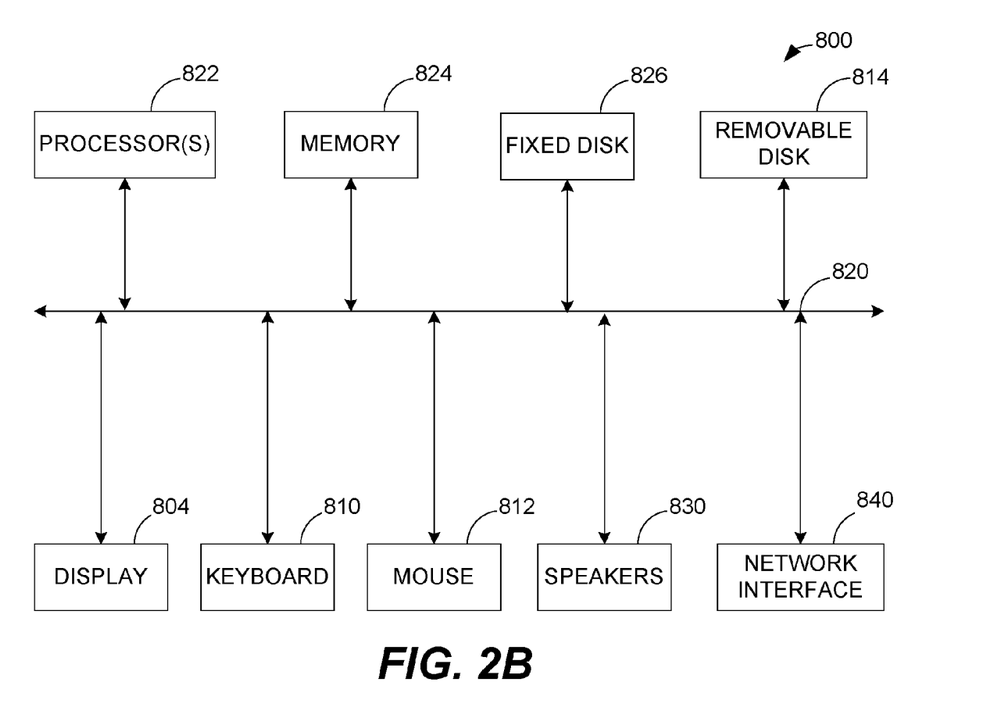

FIGS. 2A and 2B illustrate a computer system 800, which is suitable for implementing a controller 24 used in embodiments of the present invention. FIG. 2A shows one possible physical form of the computer system. Of course, the computer system may have many physical forms ranging from an integrated circuit, a printed circuit board, and a small handheld device up to a huge super computer. Computer system 800 includes a monitor 802, a display 804, a housing 806, a disk drive 808, a keyboard 810, and a mouse 812. Disk 814 is a computer-readable medium used to transfer data to and from computer system 800.

FIG. 2B is an example of a block diagram for computer system 800. Attached to system bus 820 is a wide variety of subsystems. Processor(s) 822 (also referred to as central processing units or CPUs) are coupled to storage devices, including memory 824. Memory 824 includes random access memory (RAM) and read-only memory (ROM). As is well known in the art, ROM acts to transfer data and instructions uni-directionally to the CPU and RAM is used typically to transfer data and instructions in a bi-directional manner. Both of these types of memories may include any suitable of the computer-readable media described below. A fixed disk 826 is also coupled bi-directionally to CPU 822; it provides additional data storage capacity and may also include any of the computer-readable media described below. Fixed disk 826 may be used to store programs, data, and the like and is typically a secondary storage medium (such as a hard disk) that is slower than primary storage. It will be appreciated that the information retained within fixed disk 826 may, in appropriate cases, be incorporated in standard fashion as virtual memory in memory 824. Removable disk 814 may take the form of any of the computer-readable media described below.

CPU 822 is also coupled to a variety of input/output devices, such as display 804, keyboard 810, mouse 812 and speakers 830. In general, an input/output device may be any of: video displays, track balls, mice, keyboards, microphones, touch-sensitive displays, transducer card readers, magnetic or paper tape readers, tablets, styluses, voice or handwriting recognizers, biometrics readers, or other computers. CPU 822 optionally may be coupled to another computer or telecommunications network using network interface 840. With such a network interface, it is contemplated that the CPU might receive information from the network, or might output information to the network in the course of performing the above-described method steps. Furthermore, method embodiments of the present invention may execute solely upon CPU 822 or may execute over a network such as the Internet in conjunction with a remote CPU that shares a portion of the processing.

In addition, embodiments of the present invention further relate to computer storage products with a computer-readable medium that have computer code thereon for performing various computer-implemented operations. The media and computer code may be those specially designed and constructed for the purposes of the present invention, or they may be of the kind well known and available to those having skill in the computer software arts. Examples of computer-readable media include, but are not limited to: magnetic media such as hard disks, floppy disks, and magnetic tape; optical media such as CD-ROMs and holographic devices; magneto-optical media such as floptical disks; and hardware devices that are specially configured to store and execute program code, such as application-specific integrated circuits (ASICs), programmable logic devices (PLDs) and ROM and RAM devices. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

Figure 3A:
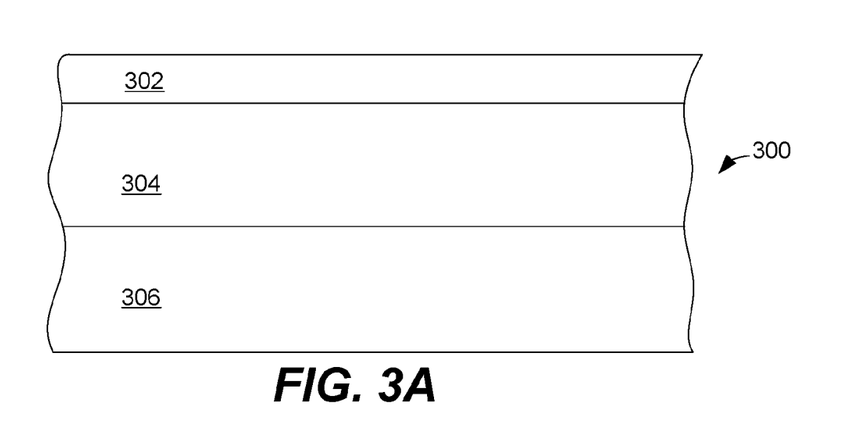
FIGS. 3A-3C are section views illustrating a two layer mask before, during, and after processing in accordance with one embodiment of the invention.
Figure 3B:
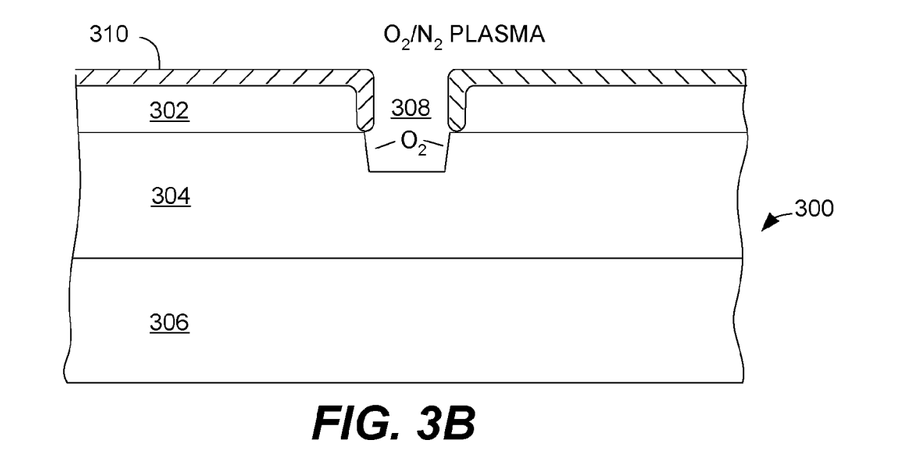
Figure 3C:
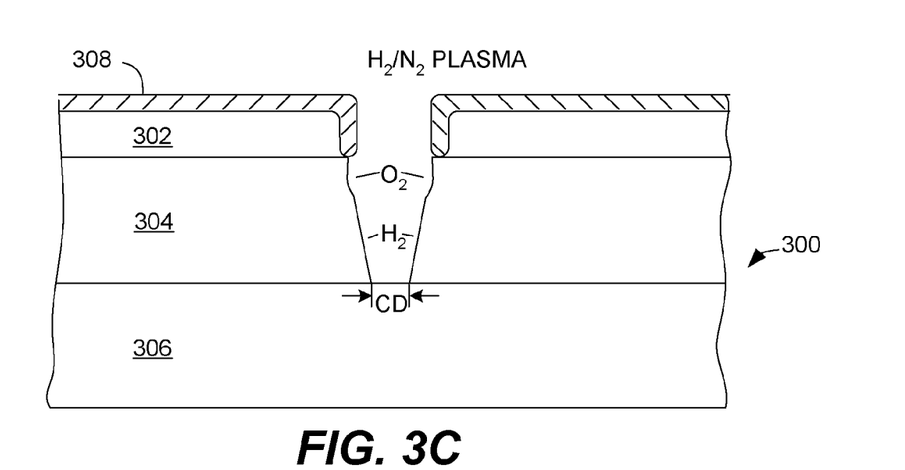

Referring now to FIGS. 3A-3C, section views are shown illustrating a two layer mask, shown generally at 300, before, during, and after processing in accordance with an embodiment of the invention. The mask comprises a top photoresist layer 302 which is impregnated with silicon (SiPR) and which is formed over a carbon layer 304 on the surface of a dielectric layer 306 such as silicon oxide and silicon nitride or on a polycrystalline silicon or a low dielectric layer such as methyl silsesquioxane, which will be etched using the two layer photoresist 302 and carbon 304 layers as a processing mask. The amount of silicon in the photoresist layer 302 is typically in the range between 3-30% by atomic weight. Carbon layer 34 is a spin-on carbon which is applied by conventional spin-on processing; however, layer 34 can be deposited via chemical vapor deposition. Formation of the carbon mask is considered conventional and taken alone is not part of the present invention.

An image of a pattern is formed in the photoresist by irradiation of the resist through an optical mask or reticle, using conventional photoresist masking techniques, leading to an opening of 150 nm, and then the patterned two-layer mask 300 is subjected to an oxygen plasma etch which etches through the patterned window 308 as shown in FIG. 3B. The oxygen ions/radicals in the plasma react with silicon in the photoresist and form a thin protective layer of silicon oxide 310 as shown in FIG. 3B. The oxygen plasma etches into the carbon layer 304, but cannot reduce the critical dimension beyond the mask dimension (pattern dimension) of 150 nm.

Accordingly, as shown in FIG. 3C, the mask structure is removed from the oxygen plasma and placed in a hydrogen plasma to complete the etching of the carbon layer 304. Since the hydrogen plasma has less lateral etching than does the oxygen plasma, the critical dimension in layer 306 can be reduced to about 120-130 nm.

Figures 4A, 4B:
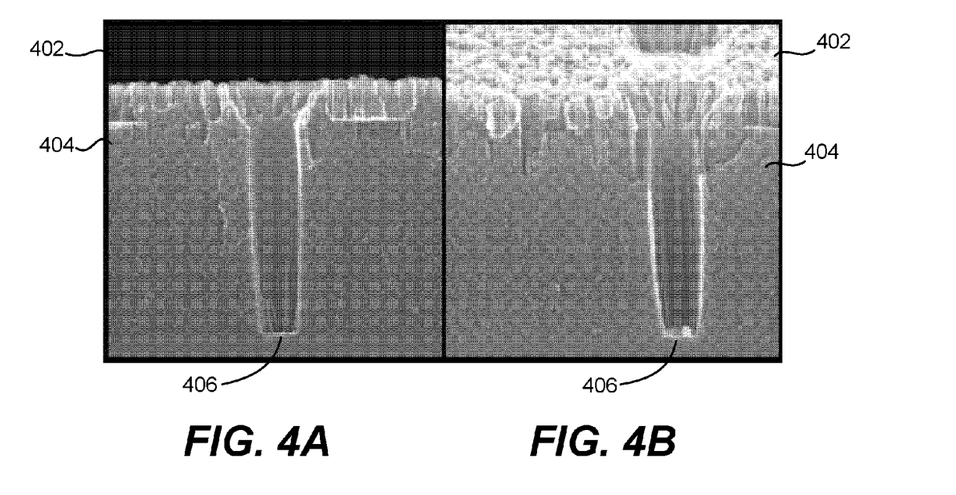
FIGS. 4A, 4B are section views illustrating the result of a spin-on carbon etch using a hydrogen ($H_2/N_2$) plasma chemistry with zero RF power at frequencies below 60 MHz.

In carrying out the invention, the low frequency RF power (i.e. less than 27 MHz) in the plasma processor is preferably reduced to less than 100 watts or eliminated. This further reduces the deterioration and pitting of the photoresist mask, as illustrated in the section views of FIGS. 4A, 4B through FIGS. 7A, 7B. FIGS. 4A, 4B illustrate the result of a spin-on carbon etch using $H_2/N_2$ plasma chemistry with no low frequency RF power. The bottom critical dimension at 406 is 125 nanometers, and the thickness of the remaining SiPR layer 402 is 140 nm and shows serious micro-pitting.

Figures 5A, 5B:
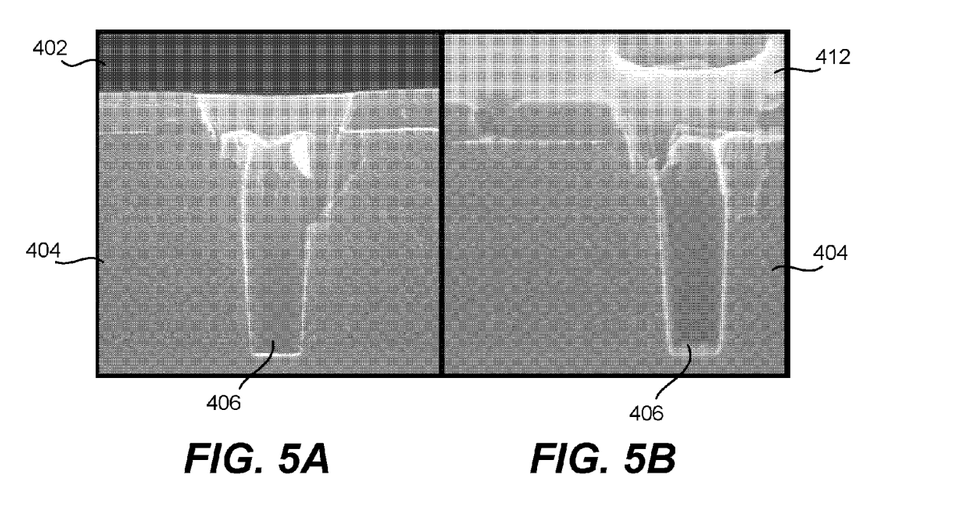
FIGS. 5A, 5B are section views illustrating the result of a spin-on carbon etch using an oxygen ($O_2/N_2$) Plasma chemistry with some RF power at frequencies below 27 MHz.

FIGS. 5A, 5B are section views illustrating the effects of using an oxidation of the SiPR 402 with an $O_2/N_2$ chemistry which forms a protective silicon oxide layer on the surface of the photoresist and which acts as a hard mask to protect the silicon PR from erosion. Here, low frequency RF power is employed during the plasma etching, and some micro-pitting remains with small holes created in the open area which travel down to the carbon layer 404.

Figures 6A, 6B:
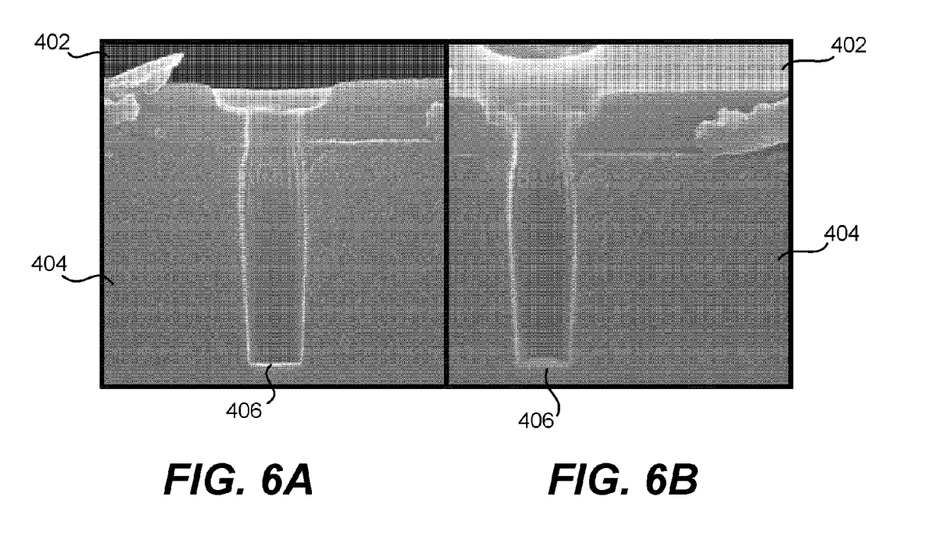
FIGS. 6A, 6B are section views illustrating the result of a spin-on carbon etch using an oxygen ($O_2/N_2$) plasma chemistry with zero RF power at frequencies below 27 MHz.

Elimination of the micro-pitting of the photoresist in an oxygen ($O_2/N_2$) plasma chemistry is possible when no low frequency RF power is used in the plasma, but the $O_2/N_2$ chemistry does not have sufficient passivation of the sidewalls to reduce the critical dimension. This is illustrated in FIGS. 6A, 6B where the bottom CD is 175 nm, and the remaining SiPR thickness is 220 nm with no visible micro-pitting.

Figures 7A, 7B:
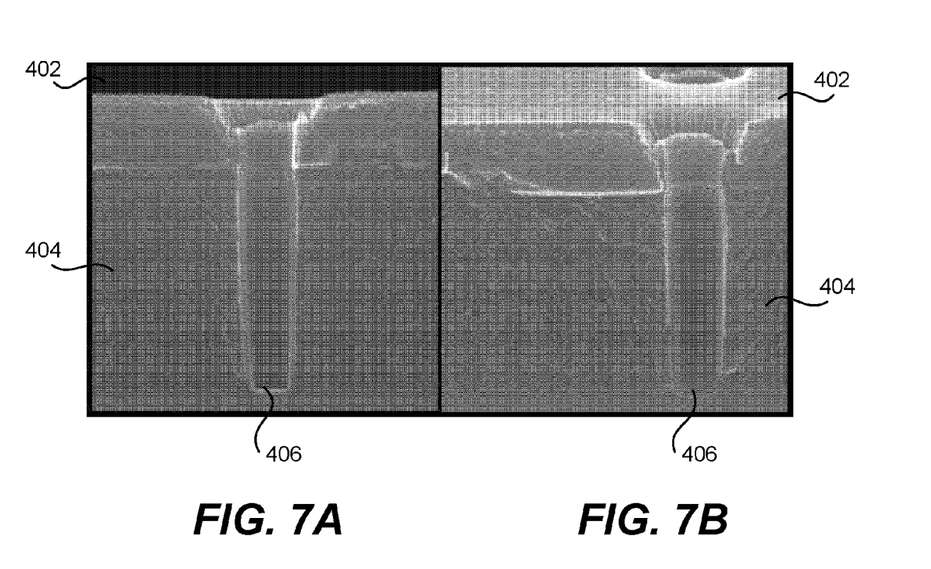
FIGS. 7A, 7B are section views illustrating the result of a spin-on carbon etch using a two step process in accordance with one embodiment of the invention with zero RF power at frequencies below 27 MHz in the first step and zero RF power at frequencies below 60 MHz in the second step.

In accordance with the invention, a required CD reduction without damage to the SiPR translated into the carbon layer employs a two step etch process in which an oxygen ($O_2$, $O_2/N_2$) plasma, preferably with low or no low frequency RF power, is employed in the first step to provide oxidation of the SiPR and eliminate micro-pitting to the carbon layer. The first step is then followed by a hydrogen ($H_2/N_2$) plasma etch with reduced or no low frequency RF power to provide the required CD reduction. This is illustrated in FIGS. 7A, 7B. The bottom CD 406 is 130 nm, and the thickness of the remaining SiPR layer 402 is 240nm with no visible micro-pitting to the carbon layer 404.

Figure 8:
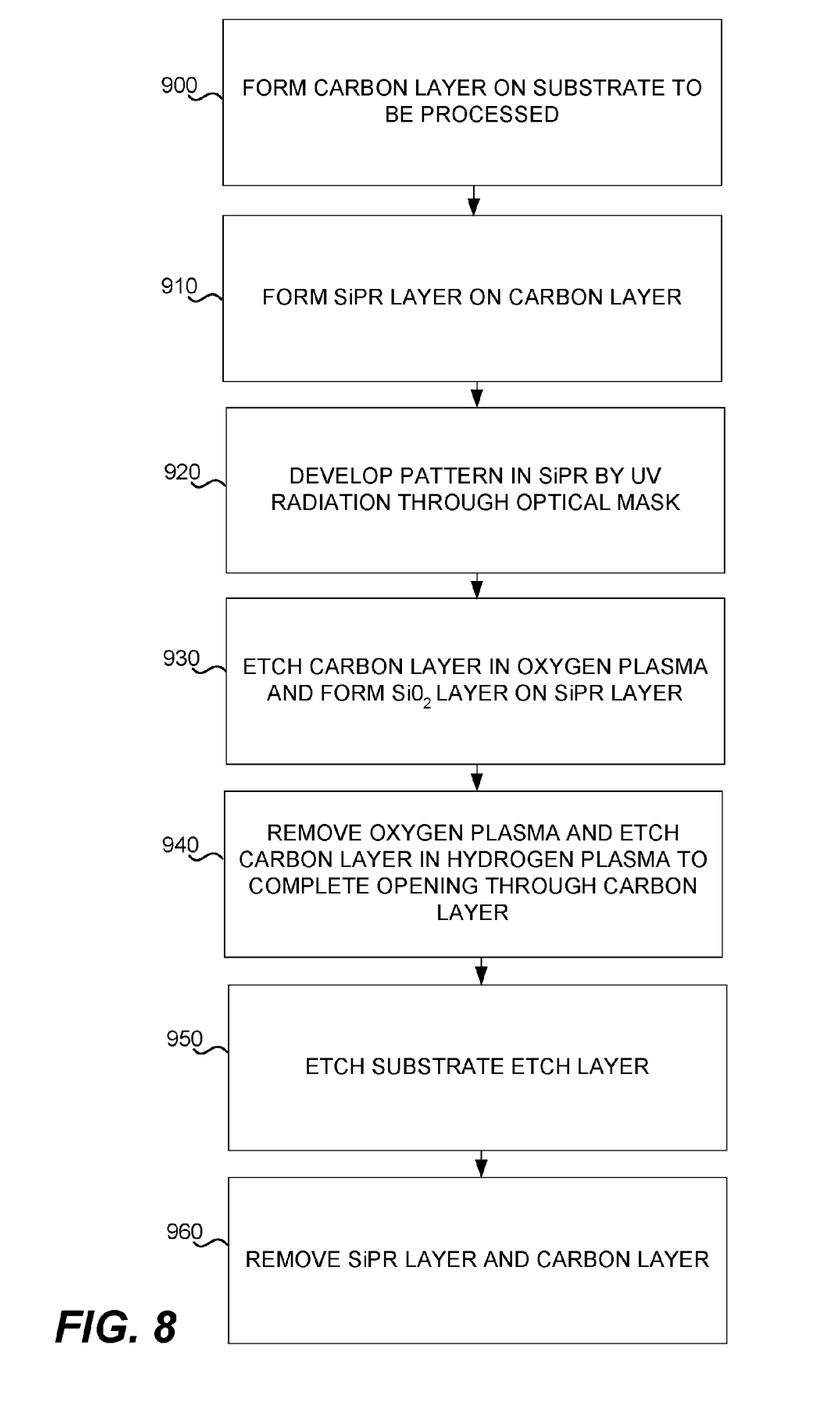
FIG. 8 is a flow diagram of a mask fabrication process in accordance with an embodiment of the invention.

FIG. 8 is a flow diagram of one embodiment of the process in forming an etch mask on a substrate. First, as shown at 900, a carbon layer is formed on an etch layer on a surface of the substrate to be processed, typically a dielectric layer such as silicon oxide or silicon nitride or a polysilicon material. The carbon layer can be deposited via chemical vapor deposition or a spin-on process, both processes being known, with a thickness of about 5,000 angstroms.

Next, as shown at 910, a silicon impregnated photoresist layer is formed on the carbon layer with a thickness of about 3,000 angstroms. As noted above, the silicon is preferably in the range of 3-30 percent by atomic weight. The photoresist is exposed to UV radiation through an optical mask or reticle to develop a pattern, as shown at 920.

Thereafter, as shown at 930, the structure is placed in an oxygen ($O_2$ or $O_2/N_2$) plasma for a minimum of 10 seconds which partially etches the carbon layer and forms a silicon oxide layer or hard mask on the photoresist layer. The oxygen plasma is then removed, and the structure is exposed to a hydrogen ($H_2/N_2$) plasma at 940 to complete the etched opening through the carbon layer. Importantly, a critical dimension (CD) in the etching or other processing of the underlying substrate through the opening in the carbon mask is reduced by using the hydrogen plasma etch.

The underlying etch layer on a substrate is then etched as shown at 950 with the critical dimension in the etch layer defined by the critical dimension etched by the hydrogen plasma at 940. After etching at 950, the photoresist layer and carbon layer are stripped from the substrate.

Following are specific recipes using the apparatus of FIGS. 1, 2A, and 2B for the oxygen plasma and for the hydrogen plasma in the process flow of FIG. 8:

For the $O_2$ etch at 930, the chamber pressure was set to 20 mTorr, 1200 watts of power at 60 MHz, 600 watts of power at 27 MHz, zero watt of power at 2 MHz with lower electrode temperature of 10 deg. C., and upper electrode temperature of 140 deg. C. Etch time was 15 seconds.

For the H2 etch, the chamber pressure was set to 100 mTorr, 1200 watts of power at 60 MHz, zero watt at 27 MHz, zero watt at 2 MHz with lower electrode temperature of 10 deg. C., and upper electrode temperature of 140 deg. C. Etch time was 60 seconds.

As noted above, the RF power during the $H_2/N_2$ plasma processing for frequencies below 60 MHz is below 100 watts and preferably below 50 watts down to, most preferably, no power. This reduces micro-pitting of the photoresist layer during the plasma processing. While the oxygen plasma is preferably from $O_2$ or $O_2/N_2$ gas, inert gas can be included with either gas. Similarly, the hydrogen plasma preferably uses $H_2/N_2$ gas but inert gas can be included in the $H_2/N_2$ gas.

The two step process for etching a two layer mask in accordance with the invention reduces adverse effects of plasma etching of the silicon containing photoresist layer while reducing the critical dimension of the carbon layer. While the invention has been described with reference to specific embodiments, the description is illustrative of the invention and is not to be construed as limiting the invention. Various applications may occur to those skilled in the art without departing from the spirit and scope of the invention as defined by the appended claims.

What is claimed is:

1. A method of processing a mask for use in fabricating a semiconductor device, the mask including a carbon layer and a silicon containing photoresist layer on the carbon layer, the photoresist layer having a pattern developed therein, the method comprising the steps of:
   a) partially etching the carbon mask through the pattern in the photoresist layer in an oxygen plasma, oxygen ions in the plasma reacting with silicon in the photoresist and forming a surface layer of silicon oxide on the photoresist, and
   b) etching the remaining carbon mask through the pattern in the photoresist layer in a hydrogen ion plasma.

2. The method of claim 1 wherein step b) enhances a critical dimension in the semiconductor device to be fabricated.

3. The method of claim 2 wherein a critical dimension is established by the ratio of oxygen plasma etching to hydrogen plasma etching.

4. The method of claim 3 wherein RF power below 60 MHz in a plasma etcher is reduced during step b) below 100 watts.

5. The method of claim 3 wherein the RF power below 60 MHz in a plasma etcher is reduced during step b) below 50 watts.

6. The method of claim 3 wherein RF power below 60 MHz in a plasma etcher is reduced during step b) to zero watt.

7. The method of claim 1 wherein in step a) the oxygen plasma is from a gas selected from the group consisting of $O_2$, $O_2/N_2$, $O_2/N_2$/inert gas, and $O_2$/inert gas.

8. The method of claim 7 wherein in step b) the hydrogen plasma is from a gas selected from the group consisting of $H_2/N_2$ and $H_2/N_2$/inert gas.

9. The method of claim 1 wherein the carbon layer comprises deposited amorphous carbon.

10. The method of claim 1 wherein the carbon layer comprises spin on carbon (SOC).

11. A method of etching an etch layer on a semiconductor substrate comprising the steps of:
   a) forming a layer of carbon on the etch layer,
   b) forming a layer of photoresist containing silicon on the layer of carbon,
   c) developing a pattern in the photoresist layer,
   d) etching the layer of carbon in an oxygen plasma, oxygen ions in the plasma reacting with silicon in the photoresist and forming a surface layer of silicon oxide on the photoresist,
   e) etching the layer of carbon in a hydrogen plasma thereby forming an opening through the carbon layer, wherein the layer of carbon is etched through the pattern in the photoresist layer,
   f) etching the etch layer through the opening in the carbon layer, and
   g) removing the layer of carbon and the layer of photoresist from the etch layer.

12. The method of claim 11 wherein the carbon layer is formed by a spin on carbon process (SOC).

13. The method of claim 11 wherein the carbon layer is formed by deposition.

14. The method of claim 11 wherein the layer of photoresist containing silicon is deposited on the layer of carbon.

15. The method of claim 14 wherein the thickness of the carbon layer is on the order of 5,000 angstroms.

16. The method of claim 15 wherein the thickness of the photoresist layer is in the range of 800 angstroms to 2,000 angstroms.

17. The method of claim 11 wherein RF power below 60 MHz in a plasma etcher is reduced during step e) below 100 watts.

18. The method of claim 11 wherein the RF power below 60 MHz in a plasma etcher is reduced during step e) below 50 watts.

19. The method of claim 11 wherein RF power below 60 MHz in a plasma etcher is reduced during step e) to zero watts.

20. The method of claim 11 wherein the etch layer comprises a dielectric material.

21. The method of claim 11 wherein the etch layer comprises polycrystalline silicon.

* * * * *